(12) United States Patent
Karnutsch et al.

(10) Patent No.: US 7,778,300 B2
(45) Date of Patent: Aug. 17, 2010

(54) OPTICALLY PUMPED SEMICONDUCTOR DEVICE

(75) Inventors: Christian Karnutsch, Karlsruhe (DE); Norbert Linder, Lappersdorf (DE); Wolfgang Schmid, Deuerling/Hillohe (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 113 days.

(21) Appl. No.: 11/579,196

(22) PCT Filed: Apr. 11, 2005

(86) PCT No.: PCT/DE2005/000649

§ 371 (c)(1),
(2), (4) Date: Sep. 14, 2007

(87) PCT Pub. No.: WO2005/107027

PCT Pub. Date: Nov. 10, 2005

(65) Prior Publication Data

US 2008/0080582 A1 Apr. 3, 2008

(30) Foreign Application Priority Data

Apr. 30, 2004 (DE) .................. 10 2004 021 265
Aug. 31, 2004 (DE) .................. 10 2004 042 146

(51) Int. Cl.
*H01S 5/00* (2006.01)
(52) U.S. Cl. .................. 372/50.124; 372/69; 372/70; 372/75
(58) Field of Classification Search ............ 372/50.124, 372/69, 70, 75
See application file for complete search history.

(56) References Cited

U.S. PATENT DOCUMENTS 6,339,607 B1 * 1/2002 Jiang et al. ............. 372/50.124

(Continued)

FOREIGN PATENT DOCUMENTS

DE 100 26 734 12/2001

(Continued)

OTHER PUBLICATIONS

Examination Report dated Dec. 7, 2007 issued for the corresponding Chinese Patent Application No. 200580013368.0.

(Continued)

*Primary Examiner*—Tod T Van Roy
(74) *Attorney, Agent, or Firm*—Cohen Pontani Lieberman & Pavane LLP

(57) ABSTRACT

A semiconductor device comprising an optically pumped vertical emitter having an active vertical emitter layer (3), and a pump radiation source, which is used to generate a pump radiation field which propagates in the lateral direction and optically pumps the vertical emitter layer (3) in a pump region, the wavelength of the pump radiation field being smaller than the wavelength of the radiation field (12) generated by the vertical emitter. The pump radiation source has an active pump layer (2), which is arranged downstream of the vertical emitter layer (3) in the vertical direction and which at least partly overlaps the vertical emitter layer as seen in the vertical direction, the active pump layer (2) being arranged in such a way that the pump radiation field generated during operation has a higher power than a parasitic laterally propagating radiation field generated by the vertical emitter layer (3) or that the generation of a parasitic laterally propagating radiation field by the vertical emitter layer (3) is suppressed.

25 Claims, 4 Drawing Sheets

U.S. PATENT DOCUMENTS

| | | |
|---|---|---|
| 6,947,460 B2 | 9/2005 | Späth et al. |
| 6,954,479 B2 | 10/2005 | Albrecht et al. |
| 7,224,710 B2 | 5/2007 | Schmid et al. |
| 2001/0030985 A1* | 10/2001 | Abeles ................ 372/43 |
| 2002/0001328 A1* | 1/2002 | Albrecht et al. ........... 372/50 |
| 2002/0075929 A1 | 6/2002 | Cunningham |
| 2003/0007538 A1 | 1/2003 | Jiang et al. |
| 2004/0022286 A1* | 2/2004 | Spath et al. ................ 372/43 |
| 2004/0042523 A1 | 3/2004 | Albrecht et al. |
| 2005/0259700 A1 | 11/2005 | Spath et al. |

FOREIGN PATENT DOCUMENTS

| | | |
|---|---|---|
| DE | 101 08 079 | 9/2002 |
| DE | 102 14 120 | 10/2003 |
| DE | 102 43 545 | 4/2004 |
| DE | 103 41 085 | 3/2005 |
| JP | 07 249824 A | 9/1995 |
| WO | WO 01/03306 | 12/2001 |
| WO | WO 01/93396 A1 | 12/2001 |
| WO | WO 02/067393 A | 8/2002 |

OTHER PUBLICATIONS

Gerhold et al., "Novel Design of a Hybrid-Cavity Surface-Emitting Laser", IEEE Journal of Quantum Electronics, IEEE Service Center, Piscataway, NJ, US, vol. 34, No. 3, pp. 506-510, Mar. 1998.

* cited by examiner

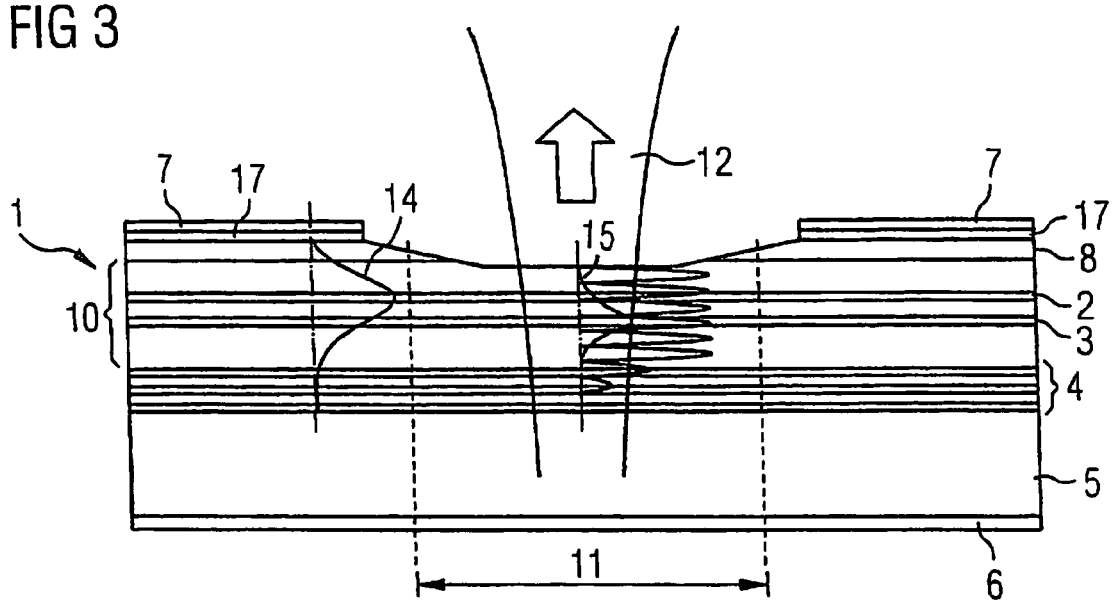
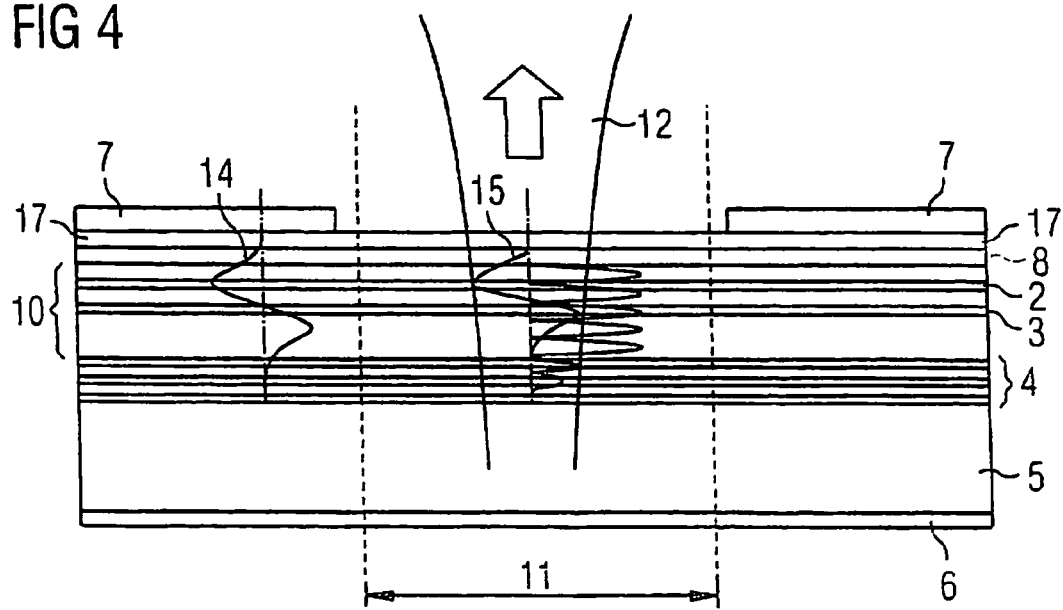

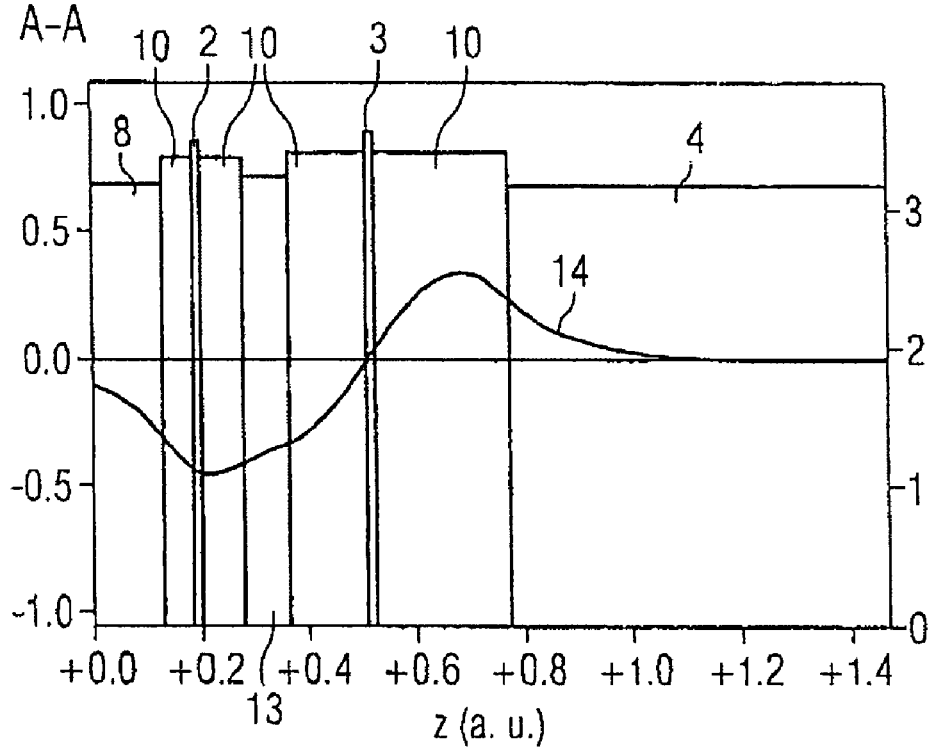
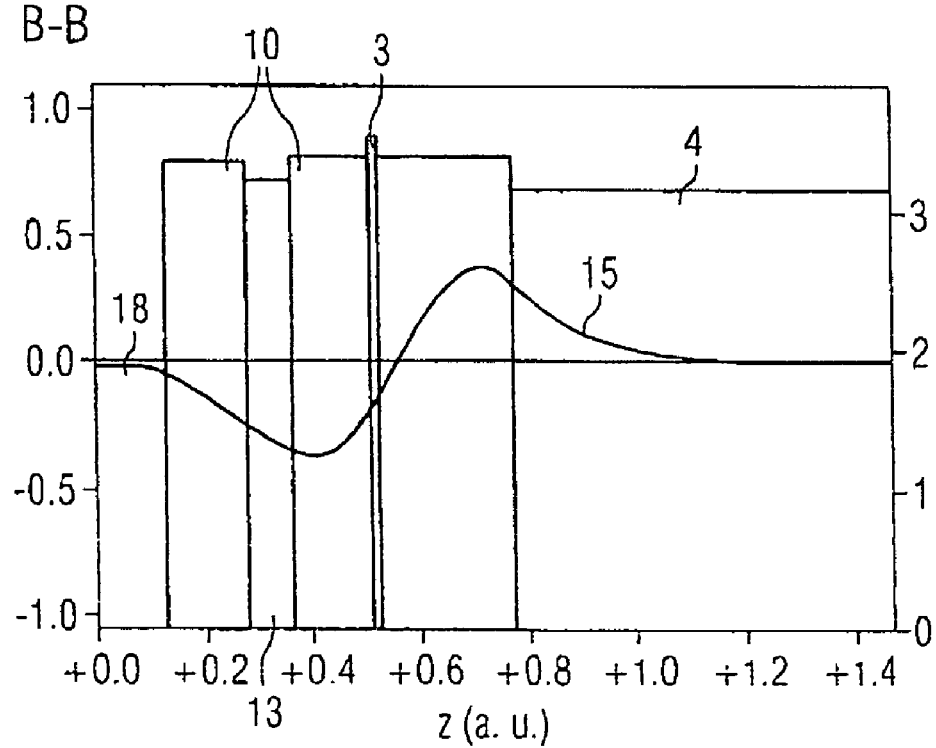

OPTICALLY PUMPED SEMICONDUCTOR DEVICE

RELATED APPLICATIONS

This is a U.S. national stage of application No. PCT/DE2005/000649, filed on Apr. 11, 2005.

This patent application claims the priority of German patent application no. 10 2004 021 265.1 filed Apr. 30, 2004 and 10 2004 042 146.3 filed Aug. 31, 2004, the disclosure content of which is hereby incorporated by reference.

FIELD OF THE INVENTION

The present invention relates to an optically pumped semiconductor device comprising an optically pumped vertical emitter having an active vertical emitter layer, and a pump radiation source, which is used to generate a pump radiation field which propagates in the lateral direction and optically pumps the vertical emitter layer in a pump region, the wavelength of the pump radiation field being less than the wavelength of the radiation field generated by the vertical emitter.

BACKGROUND OF THE INVENTION

A semiconductor device of the generic type is known from the document WO 01/93396, for example, which describes an optically pumped vertical emitter embodied in monolithically integrated fashion together with a pump radiation source, for example an edge emitting semiconductor laser.

In order to achieve a high pump efficiency, it is necessary for the pump wavelength to be smaller than the emission wavelength of the vertical emitter. The different wavelengths are achieved for example by means of different structures and materials compositions of pump radiation source and vertical emitter, respectively.

Such a semiconductor device can be produced for example by firstly growing the layers for the vertical emitter over the whole area on a substrate and subsequently partially etching said layers away again in laterally outer regions. In a second epitaxy step, the layers for the pump radiation source, for example an edge emitting semiconductor laser, are grown in the etched-away regions.

However, production by means of two separate epitaxy steps is relatively complex. Furthermore, care must be taken to ensure that a good optical transition is formed between the pump radiation source and the vertical emitter, in order that absorption losses at this location are kept small.

An optically pumped semiconductor device having a single continuous active layer with a quantum well structure is furthermore known from Gerhold et al., IEEE Journal of Quantum Electronics, Vol. 34, No. 3, 1998, pages 506 to 511. The quantum well structure of the active layer is intermixed in the laterally outer regions, so that radiation having a shorter wavelength is generated in this region in comparison with the central region, said radiation serving as pump radiation for the central region.

Since only a single active layer is formed, however, the pump wavelength can only be varied in a comparatively small range. Moreover, there is the risk of the optical properties of the semiconductor body being impaired by the intermixing of the quantum well structures in the laterally outer regions, which may lead to a reduction of the pump efficiency.

SUMMARY OF THE INVENTION

It is an object of the present invention to provide an optically pumped semiconductor device of the type mentioned in the introduction which can be produced relatively simply. In particular, this device is intended to be able to be produced in one epitaxy method without interruption.

This and other objects are attained in accordance with one aspect of the present invention directed to a semiconductor device comprising an optically pumped vertical emitter having an active vertical emitter layer, and a pump radiation source, which is used to generate a pump radiation field which propagates in the lateral direction and optically pumps the vertical emitter layer in a pump region, the wavelength of the pump radiation field being smaller than the wavelength of the radiation field generated by the vertical emitter. The pump radiation source has an active pump layer, which is arranged above or below the vertical emitter layer in the vertical direction and which at least partly overlaps the vertical emitter layer as seen in the vertical direction, the active pump layer being arranged in such a way that the pump radiation field generated during operation has a higher power than a parasitic laterally propagating radiation field generated by the vertical emitter layer or that the generation of a parasitic laterally propagating radiation field by the vertical emitter layer is suppressed.

The pump radiation source is preferably embodied as an edge emitter, in particular as an edge emitting laser. It is further preferred for the pump radiation source in the form of a pump laser and the vertical emitter to be monolithically integrated into a common semiconductor body. In this case, by way of example, the laser resonator of the pump laser may be formed by lateral areas of the semiconductor body, with the result that the pump region of the vertical emitter and more extensively the active vertical emitter layer are arranged within the laser resonator.

The invention is based on a concept of successively growing the active vertical emitter layer and the active pump layer in one epitaxy process, without the need to interrupt the epitaxy process for the removal of layers that have already been grown. Since the pump wavelength, with regard to an efficient pump process, is smaller than the emission wavelength of the vertical emitter, care must be taken to ensure that a laterally propagating radiation field is not also generated in the vertical emitter layer. Such a parasitic radiation field would have the same wavelength as the vertically emitted radiation and would therefore pump the vertical emitter only inadequately. The occurrence of such a radiation field is undesirable for this reason. In the case of the present invention, the pump layer is arranged in such a way that the pump radiation field generated during operation has at least a higher power than a parasitic lateral propagating radiation field generated by the vertical emitter layer, the generation of such a parasitic radiation field preferably being suppressed to the greatest possible extent or even completely.

The semiconductor device according to the invention can be produced relatively simply. In particular, it is not necessary to interrupt the epitaxy process after the growth of the vertical emitter in order to remove parts of the layer sequence again and to grow the pump radiation source anew in a second epitaxy step. Furthermore, the semiconductor device according to the invention is distinguished by a high pump efficiency on account of the separation of the active pump layer and the active vertical emitter layer, it being possible for the pump wavelength and the emission wavelength to be set freely within wide limits depending on the configuration of the respective active layer.

In one preferred configuration of the invention, the pump radiation source is electrically excited by charge carrier injection, for instance the injection of charge carriers of a first charge type and charge carriers of a second charge carrier type, for generation of the pump radiation. Said charge carriers generally have different net trapping rates depending on the type. In this case, the net trapping rate corresponds to the probability of a charge carrier recombining in the pump layer. The net trapping rate depends, inter alia, on the mobility of the respective charge carriers. Preferably, the charge carriers of the first charge carrier type have a higher net trapping rate than the charge carriers of the second charge carrier type and are injected into the semiconductor device from a side, the pump layer being at a smaller distance from said side than the vertical emitter layer. An equality of the pump layer and the vertical emitter layer is cancelled by means of this arrangement, so that the charge carrier injection excites generation of radiation primarily in the pump layer.

In a further configuration of the invention, a barrier having a selectivity with regard to the charge carrier type is formed between the vertical emitter layer and the pump layer. This likewise cancels the equality between the pump layer and the vertical emitter layer, so that the injected charge carriers recombine to an increased extent in the pump layer and the generation of a laterally propagating parasitic radiation field by the vertical emitter layer is thus largely avoided.

In a further preferred embodiment of the invention, the semiconductor device is doped partly with the first conductivity type and partly with the second conductivity type, so that a space charge zone is formed at the transition of the doping from the first to the second conductivity type. In this case, the pump layer is arranged within the space charge zone and the vertical emitter layer is arranged outside the space charge zone, with the consequence that generation of radiation by the pump layer is primarily excited on account of the charge carrier injection, and excitation of a parasitic radiation field in the vertical emitter layer is largely avoided.

The features of the invention that have been mentioned up to now have related, in respect of primary generation of radiation by the pump layer, in particular to the arrangement thereof with regard to electrical excitation by means of charge carrier injection.

In a further configuration of the invention, the semiconductor device has a waveguide in which both the vertical emitter layer and the pump layer are arranged, the arrangement of the pump layer being chosen in such a way that the pump radiation field generated during operation has a higher power than a parasitic laterally propagating radiation field. Particularly preferably, the generation of a parasitic radiation field by the vertical emitter layer is completely suppressed. Such an arrangement of the active layers within a waveguide may be provided as an alternative or in combination with the features of the invention that have already been mentioned.

A pump mode having a filling factor $\Gamma_p$ in respect of the pump layer and a filling factor $\Gamma_v$ in respect of the vertical emitter layer is assigned to the waveguide, the pump layer preferably being arranged in such a way that the filling factor $\Gamma_p$ of the pump layer is greater than the filling factor $\Gamma_v$ of the vertical emitter layer. For this purpose, in a first configuration of the invention, the pump layer may be arranged closer to an intensity maximum of the pump mode than the vertical emitter layer, so that the filling factor $\Gamma_p$ of the pump layer, that is to say the overlap between the pump mode and the pump layer, is greater than the corresponding overlap between the pump mode and the vertical emitter layer. This results in greater coupling of the pump layer to the pump radiation field and thus preferred generation of radiation by means of the pump layer.

A higher filling factor of the pump layer compared with the vertical emitter layer may also be obtained, on the other hand, by virtue of the fact that a mode having a zero crossing, that is to say a node, is chosen as the pump mode and the vertical emitter layer is arranged closer to the zero crossing than the pump layer. In this way, a particularly low filling factor is obtained for the vertical emitter layer and advantageously high coupling of the pump radiation field to the pump layer is consequently achieved.

In one preferred development of the invention, within the pump region, the absorption of the pump radiation in the vertical emitter layer is increased compared with laterally adjoining regions of the vertical emitter layer. This brings about, on the one hand, an advantageously high efficiency of the optical pump process. On the other hand, the lateral propagation of the pump radiation field outside the pump region is not impaired by the vertical emitter layer in this way.

In the present invention, an increased absorption of the pump radiation field within the pump region is preferably realized in conjunction with the abovementioned waveguide by the wave-guiding properties of the waveguide being modified within the pump region compared with laterally adjoining regions. This modification is further preferably configured in such a way that the ratio $\Gamma_p/\Gamma_v$ of the abovementioned filling factors of the pump layer $\Gamma_p$ and of the vertical emitter layer $\Gamma_v$ is decreased within the pump region compared with laterally adjoining regions. A corresponding modification of the wave-guiding properties is possible for example by partly removing parts of the waveguide or parts of layers adjoining the latter within the pump region or by oxidizing or chemically converting in some other way parts of the waveguide or of layers adjoining the latter within the pump region for the purpose of a change in refractive index.

In a further preferred embodiment of the invention, the above mentioned advantageous increase in the absorption within the pump region is achieved by the pump layer being at least partly removed within the pump region. It should be noted that, in contrast to the abovementioned prior art, this removal of the pump layer may be effected after the epitaxial growth of the individual semiconductor layers and, in particular, does not require a subsequent further epitaxy process.

One advantageous development of the invention consists in the fact that means which suppress the generation of a vertically propagating parasitic radiation field are provided outside the pump region. This prevents modes that propagate vertically from building up in an undesirable manner outside the pump region. Modes of this type are generally not coupled out from the semiconductor body, but rather are absorbed in the semiconductor body or contact metalizations applied thereto. Accordingly, they do not contribute to the generation of the vertically emitted radiation field in the pump region and do not impair the efficiency of the semiconductor device.

In order to suppress such vertically propagating parasitic modes, the invention provides for the contact metalizations that are required for electrical operation to be formed with a comparatively low reflectivity, which is chosen in particular to be so low that vertical modes cannot build up oscillations. More extensively, such vertical modes can be avoided by providing an absorber layer outside the pump region, by means of which absorber layer such high losses are added to vertical modes in a targeted manner that oscillation build-up of said modes is suppressed. Finally, it is also possible to oxidize a Bragg mirror provided for the vertical emitter within the pump region, so that its reflectivity is significantly lower outside the pump region than within the pump region.

In a similar manner to the low reflectivity of the contact metalization, it is thus possible to avoid oscillation build-up of vertical parasitic modes.

BRIEF DESCRIPTION OF THE DRAWINGS

FIG. 3 shows a schematic sectional illustration of a third exemplary embodiment of a semiconductor device according to the invention, FIG. 4 shows a schematic sectional illustration of a fourth exemplary embodiment of a semiconductor device according to the invention, FIG. 7 shows a graphical illustration of the field profile of the pump radiation field outside the pump region alone line A-A of the embodiment shown in FIG. 6, and FIG. 8 shows a graphical illustration of the field profile of the pump radiation field within the pump region along line B-B of the embodiment shown in FIG. 6.

DETAILED DESCRIPTION OF THE DRAWINGS

Identical or identically acting elements are provided with the same reference symbols in the Figures.

Figure 1:
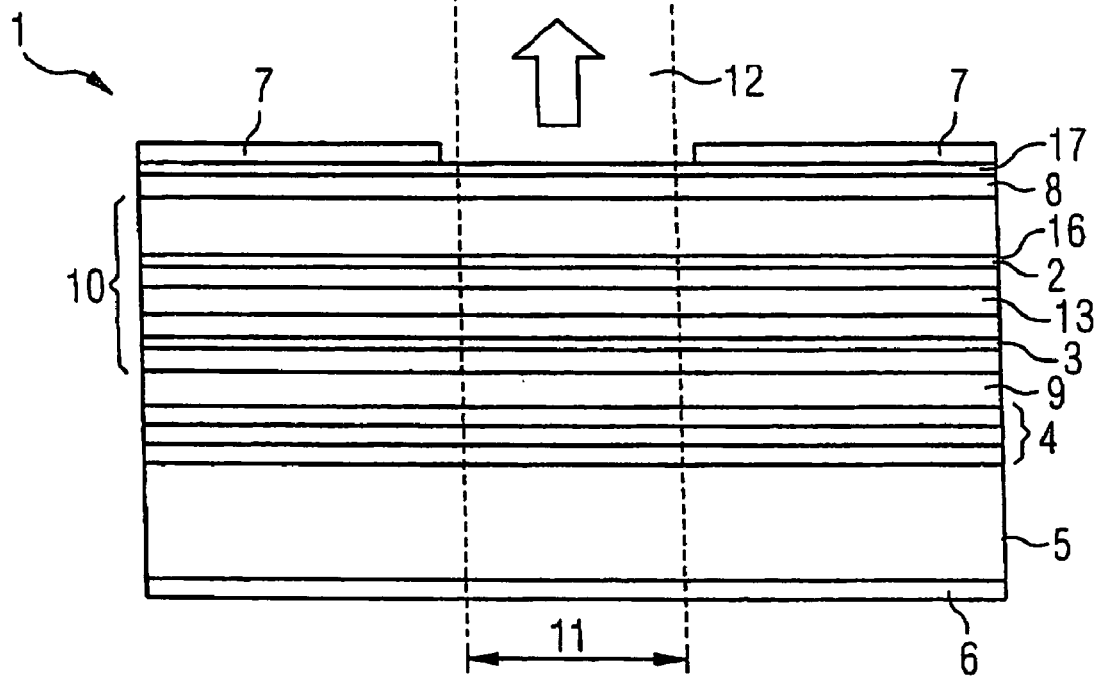
FIG. 1 shows a schematic sectional illustration of a first exemplary embodiment of a semiconductor device according to the invention.

The exemplary embodiment of an optically pumped semiconductor device according to the invention as illustrated in figure 1 has a semiconductor body 1 comprising an active pump layer 2 and also an active vertical emitter layer 3, which is arranged below the active pump layer 2 in the vertical direction, the pump layer 2 and the vertical emitter layer 3 being arranged parallel to one another.

The pump layer 2 and the vertical emitter layer 3 are furthermore formed within a waveguide 10 adjoined by a first cladding layer 8 and by an oppositely disposed second cladding layer 9.

Arranged below the waveguide in the vertical direction are a Bragg mirror 4 and a substrate 5, which is provided with a contact metalization 6 on the side remote from the semiconductor layers. Corresponding thereto, on the opposite side of the semiconductor body, a contact layer 17 and a second contact metalization 7, which has a cutout within the pump region 11, are applied on the first cladding layer 8. In said pump region 11, the radiation 12 that is generated by the vertical emitter layer and emitted in the vertical direction is coupled out.

Moreover, a charge-carrier-selective barrier layer 13 is arranged between the pump layer 2 and the vertical emitter layer 3.

The exemplary embodiment shown may be realized for example on the basis of the AlInGaAl material system $((Al_xIn_{1-x})_yGa_{1-y}As$, where $0\leq x\leq 1, 0\leq y\leq 1)$ or the AlInGaP material system $((Al_xIn_{1-x})_yGa_{1-y}P$, where $0\leq x\leq 1, 0\leq y\leq 1)$, in the last-mentioned case for instance with a pump wavelength of 630 nm and an emission wavelength of the vertical emitter of approximately 650 nm. In this case, a current blocking layer, for example an $Al_{0.5}In_{0.5}P$ layer in an $(Al_{0.5}Ga_{0.5})_{0.5}In_{0.5}P$ waveguide, may be provided as the barrier layer 13.

For an AlInGaAs-based structure corresponding to FIG. 1, the layer material and thickness and also the doping are specified by way of example in the table below. In the case of this structure, the Bragg mirror 4 comprises 30 layer pairs each comprising an $Al_{1.0}Ga_{0.0}As$ layer and an $Al_{0.2}Ga_{0.8}As$ layer and, on the side remote from the substrate, a terminating $Al_{1.0}Ga_{0.0}As$ layer. In the case of an oxidized Bragg mirror, that is to say in which the $Al_{1.0}Ga_{0.0}As$ layers are oxidized to form $Al_2O_3$ layers, approximately six layer pairs are sufficient.

| Thickness | Material | Doping | Element |
|---|---|---|---|
| 200 nm | GaAs | p   C, $1 \times 10^{20}$ cm$^{-3}$ | Contact layer 17 |
| 1500 nm | $Al_{0.6}Ga_{0.4}As$ | p   C, $1 \times 10^{18}$ cm$^{-3}$ | Cladding layer 8 |
| 120 nm | $Al_{0.2}Ga_{0.8}As$ | — — | Waveguide 10 |
| 10 nm | $In_{0.13}Ga_{0.87}As$ | — — | Active pump layer 2 |
| 120 nm | $Al_{0.2}Ga_{0.8}As$ | — — | Waveguide 10 |
| 120 nm | $Al_{0.6}Ga_{0.4}As$ | n   Te, $1 \times 10^{17}$ cm$^{-3}$ | Barrier layer 13 |
| 225 nm | $Al_{0.2}Ga_{0.8}As$ | n   Te, $1 \times 10^{17}$ cm$^{-3}$ | Waveguide 10 |
| 10 nm | $In_{0.16}Ga_{0.84}As$ | n   Te, $1 \times 10^{17}$ cm$^{-3}$ | Active vertical emitter layer 3 |
| 375 nm | $Al_{0.2}Ga_{0.8}As$ | n   Te, $1 \times 10^{17}$ cm$^{-3}$ | Waveguide 10 |
| 375 nm | $Al_{0.6}Ga_{0.4}As$ | n   Te, $1 \times 10^{17}$ cm$^{-3}$ | Cladding layer 9 |
| 75 nm | $Al_{1.0}Ga_{0.0}As$ | n   Te, $1 \times 10^{17}$ cm$^{-3}$ | Bragg Mirror 4 |
| 75 nm (30x) | $Al_{0.2}Ga_{0.8}As$ | n   Te, $1 \times 10^{17}$ cm$^{-3}$ | |
| 75 nm (30x) | $Al_{1.0}Ga_{0.0}As$ | n   Te, $1 \times 10^{17}$ cm$^{-3}$ | |
| | GaAs | n   Te, $1 \times 10^{17}$ cm$^{-3}$ | Substrate 5 |

It goes without saying that the invention is not restricted to this material system, but rather can also be realized, depending on wavelength and other requirements, on the basis of other semiconductor material systems such as, for example, $((Al_xIn_{1-x})_yGa_{1-y}As_zP_{1-z}$ where $0\leq x\leq 1, 0\leq y\leq 1, 0\leq z\leq 1$ or $(Al_xIn_{1-x})_yGa_{1-y}N$ where $0\leq x\leq 1, 0\leq y\leq 1$.

In the exemplary embodiment shown, the pump radiation source is preferably embodied as an edge emitting pump laser, the laser-active medium of which constitutes the pump layer 2. The laser resonator is formed by the lateral areas 16 that laterally delimit the pump layer 2, so that the vertical emitter layer 3 and, in particular, the pump region 11 of the vertical emitter are arranged within the pump laser resonator.

During operation, charge carriers for generating the pump radiation are injected into the semiconductor body via the contact metalizations 6 and 7. In this case, holes are injected as first charge carrier type from the coupling-out side or the contact metalization 7, and electrons are injected as second charge carrier type via the opposite contact metalization 6.

On account of the different mobilities of the two charge carrier types, holes have a higher net trapping rate than electrons in the exemplary embodiment shown. Therefore, the pump layer 2 is arranged closer to the contact metalization 7 than the vertical emitter layer, so that the holes which are coupled in by means of the contact metalization 7 are preferably available for radiative recombination in the pump layer 2 and generate the pump radiation field there.

Moreover, the charge-carrier-selective barrier layer 13 serves to prevent holes from diffusing into the underlying vertical emitter layer 3, with the result that the probability of the injected charge carriers recombining in the pump layer 2 is increased further.

In the case of the exemplary embodiment illustrated in FIG. 1, moreover, the substrate 5, the Bragg mirror 4, the cladding layer 9, the subsequent region of the waveguide 10, the vertical emitter layer 3, the subsequent region of the waveguide 10 and the barrier layer 13 are doped with a first conductivity type. The subsequent region of the waveguide, the pump layer 2 and the succeeding region of the waveguide are undoped, and the first cladding layer 8 on the top side is doped with the second conductivity type. By way of example, the first conductivity type corresponds to an n-type doping and the second conductivity type corresponds to a p-type doping.

On account of this doping, a space charge zone forms in the region of the pump layer 2, the vertical emitter layer 3 being arranged outside said space charge zone.

As already described, in the case of the invention the pump layer 2 is embodied in such a way that the pump radiation generated has a shorter wavelength than the radiation 12 that is generated by the vertical emitter layer 3 within the pump region 11 and is emitted in the vertical direction. If the pump layer 2 and the vertical emitter layer 3 exhibited equality in this case, then on account of the wavelength difference, in the event of simultaneous electric excitation, a laterally propagating radiation field would initially be excited by the vertical emitter layer 3. This is undesirable for the reasons mentioned and is intended largely to be avoided.

For this purpose, three measures are provided in the case of the exemplary embodiment shown in FIG. 1, namely the small distance between the pump layer 2 and that side from which the charge carriers having the higher net trapping rate are injected, the arrangement of a barrier layer 13 between the pump layer 2 and the vertical emitter layer 3, and the formation of a space charge zone, so that the pump layer 2 lies within the space charge zone and the vertical emitter layer 3 lies outside the space charge zone. These three measures cancel an equality of the pump layer 2 and the vertical emitter layer 3 in respect of simultaneous electrical excitation, so that a laterally propagating pump radiation field is primarily generated by the pump layer 2.

Depending on the intensity of the electrical excitation, the generation of a parasitic laterally propagating radiation field by the vertical emitter layer 3 is suppressed completely or at least to such a great extent that the power of the pump radiation field is greater than the power of the parasitic radiation field. It should be noted that, in the context of the invention, just one of the measures mentioned may suffice for avoiding a parasitic radiation field. On the other hand, particularly in the event of intense excitation, even further measures may be required to prevent the vertical emitter layer from building up a laterally propagating radiation field.

Figure 2:
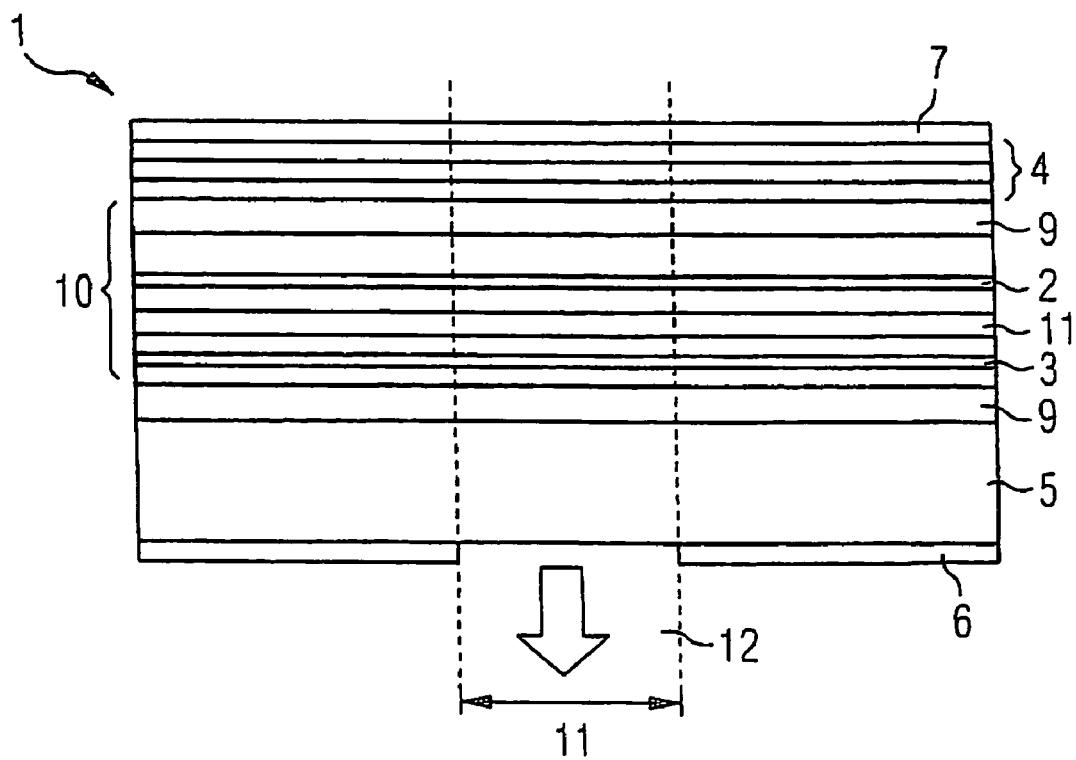
FIG. 2 shows a schematic sectional illustration of a second exemplary embodiment of a semiconductor device according to the invention.

The exemplary embodiment illustrated in FIG. 2 has a construction corresponding to FIG. 1 in respect of the pump layer 2, the vertical emitter layer 3, the intervening barrier layer 13, the waveguide 10, the adjoining cladding layers 8 and 9 and also the Bragg mirror 4.

In contrast to the exemplary embodiment illustrated in FIG. 1, however, radiation is coupled out through the substrate 5, the contact metallization 6 applied on the substrate having a cutout within the pump region for coupling out the radiation 12 emitted in the vertical direction. By contrast, the opposite contact metalization 7 arranged on the Bragg mirror 4 is formed in a continuous manner and without a cutout.

The exemplary embodiment illustrated in FIG. 2 requires the substrate 5 to be sufficiently radiation-transmissive in respect of the vertically emitted radiation 12 generated. Since electrically conductive substrates sometimes have a restricted transparency, it may be expedient for the substrate to be partly or else completely removed within the pump region (not illustrated).

Like the exemplary embodiment illustrated in FIG. 1, too, the exemplary embodiment shown in FIG. 2 has the above-mentioned three measures for suppressing a parasitic radiation field in the vertical emitter layer, it also being the case, if appropriate, that one or two of said measures may be sufficient, or further measures are necessary for suppressing a parasitic radiation field. In particular, the position of the pump layer 2 and the vertical emitter layer 3 may be interchanged in the two exemplary embodiments.

FIG. 3 illustrates a third exemplary embodiment of the invention. In a manner similar to that in the previous exemplary embodiments, the semiconductor body 1 has a substrate 5, to which a Bragg mirror 4, a waveguide 10 and a cladding layer 8 are successively applied. Within the waveguide, the active pump layer 2 is formed and the vertical emitter layer 3 is formed parallel to and in a manner arranged below the pump layer 2 in the vertical direction. The substrate 5 is provided with a contact metalization 6 and, disposed opposite thereto, the cladding layer 8 is provided with a contact metalization 7.

A pump mode 14 is defined by the waveguide 10. The overlap between said pump mode and one of the active layers is referred to as the filling factor. The greater said filling factor, the greater the coupling of the respective active layer to the pump radiation field. In the context of the invention it is provided that the pump layer is intended to have a highest possible filling factor $\Gamma_p$ outside the pump region 11. For this purpose, in the exemplary embodiment shown, the pump layer 2 is arranged at an intensity maximum of the pump mode 14 and the vertical emitter layer 3 is spaced apart therefrom in such a way that the filling factor of the pump layer $\Gamma_p$ is greater than the filling factor of the vertical emitter layer $\Gamma_v$.

On account of the larger filling factor $\Gamma_p$, the pump layer 2 couples to a radiation field propagating laterally in the waveguide more intensely than the vertical emitter layer 3, so that, on the one hand, pump radiation is generated primarily in the waveguide, and, on the other hand, the vertical emitter layer 3 scarcely impairs the lateral propagation of the pump radiation field outside the pump region 11.

It should be noted that, in the context of the invention, there are also other possibilities for reducing an absorption of the pump radiation outside the pump region in the vertical emitter layer 3. By way of example, the vertical emitter layer could be excited so intensely outside the pump region that it bleaches and its transmission is thus increased. On account of the intense excitation, however, the risk of vertically propagating parasitic modes forming increases in this case, so that the above-mentioned possibilities are to be regarded as more advantageous.

An intensified coupling of the vertical emitter layer 3 to the pump radiation field is provided within the pump region 11, by contrast, since the vertical emitter is optically pumped by the pump radiation field in said region. For this purpose, the wave-guiding properties of the waveguide are modified within the pump region 11 in such a way that the filling factor of the vertical emitter layer $\Gamma_v$ is increased, or the ratio of the filling factors $\Gamma_p/\Gamma_v$ is reduced compared with laterally adjoining regions outside the pump region 11.

In the case of the exemplary embodiment shown, this is achieved by trapezoidally removing the cladding layer 8 and parts of the waveguide 10 within the pump region 11, which leads to a reduction of the waveguide width. The shallowly obliquely running sidewalls of the cutout bring about a continuous transition in the wave-guiding properties toward the pump region, as a result of which undesirable reflections and scattering losses are avoided.

The intensity maximum of the pump mode 15 is thus shifted in the direction of the vertical emitter layer 3, so that the filling factor $\Gamma_v$ thereof is increased and the filling factor $\Gamma_p$ of the pump layer 2 is reduced. The shift in the intensity maximum is illustrated schematically on the basis of the pump mode 15 within the pump region. Furthermore, FIG. 3 schematically shows the intensity distribution of the vertically emitted radiation field 12 within the semiconductor body. The illustration likewise shows the lateral extent of the vertically emitted radiation field 12, for instance the 1/e radius of the radiation field, which increases due to diffraction in the emission direction.

FIG. 4 shows a fourth exemplary embodiment of the present invention. The semiconductor device largely corresponds to the exemplary embodiment illustrated in FIG. 3. In contrast thereto, the waveguide 10 has no removal in the pump region 11, and the Bragg mirror 4 is oxidized within the pump region 11. The number of mirror periods (number of layer pairs) can advantageously be reduced in the case of an oxidized Bragg mirror compared with a non-oxidized Bragg mirror. Thus, by way of example, approximately 5 to 10 mirror periods suffice for an oxidized Bragg mirror, whereas 25 to 50 mirror periods are typically provided in the case of a non-oxidized Bragg mirror. A smaller number of mirror periods reduces both the production outlay and the thermal resistance of the Bragg mirror.

A Bragg mirror based on the GaAS/AlGaAs material system, preferably layers having a high proportion of aluminum, is suitable, in particular for an oxidized Bragg mirror. Such layers can be oxidized for example in moist thermal fashion, for instance in a water vapor atmosphere at an elevated temperature of 400° C. As a result of the oxidation of the aluminum-containing layers, the refractive index thereof is critically altered and the desired modification of the wave-guiding properties is consequently realized as a result.

In this exemplary embodiment, the waveguide 10 is dimensioned in such a way that the pump mode has a zero crossing, that is to say a node. In this case, as in the previous exemplary embodiment, the pump layer 2 is arranged at an intensity maximum of the pump mode 14, whereas the vertical emitter layer is arranged at the zero crossing of the pump mode 14. A maximum filling factor $\Gamma_p$ of the pump layer 2 in conjunction with a minimum filling factor $\Gamma_v$ of the vertical emitter layer 3 is thereby realized.

The wave-guiding properties of the waveguide 10 are once again modified within the pump region 11 in such a way that the ratio of the filling factors $\Gamma_p/\Gamma_v$ decreases, that is to say that the coupling of the active layers is shifted from the pump layer 2 to the vertical emitter layer 3. In the exemplary embodiment shown, this is achieved by the partial oxidation of the Bragg mirror 4 adjoining the waveguide 10.

The oxidation of the Bragg mirror leads to an alteration of the jump in refractive index between waveguide 10 and Bragg mirror 4, so that outside the pump region 11, the pump mode 14 penetrates more deeply into the Bragg mirror, as illustrated. Within the pump region 11, by contrast, the Bragg mirror 4 is oxidized, so that the jump in refractive index is significantly higher than in the laterally adjoining regions, and the zero crossing of the pump mode 15 is shifted in the direction of the pump layer 2 and thus away from the vertical emitter layer 3. As a result, the filling factor $\Gamma_v$ of the vertical emitter layer increases and, consequently, so does the coupling or the absorption of the pump radiation field in the vertical emitter layer.

Figure 5:
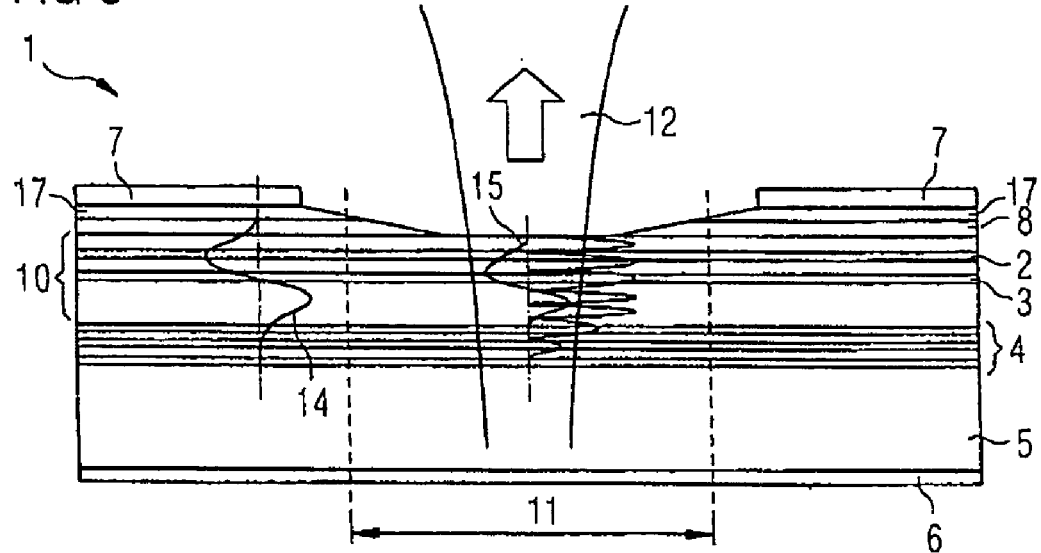
FIG. 5 shows a schematic sectional illustration of a fifth exemplary embodiment of a semiconductor device according to the invention.

FIG. 5 illustrates a fifth exemplary embodiment of the invention. This exemplary embodiment combines features of the two exemplary embodiments illustrated in FIG. 3 and FIG. 4. The semiconductor body is largely like the semiconductor body illustrated in FIG. 3 and has, in particular, a recess in the cladding layer 8 or in both the cladding layer 8 and the waveguide 10 within the pump region 11. By contrast, a mode having a zero crossing is provided as pump mode 14 as in the case of the exemplary embodiment illustrated in FIG. 4, the pump layer 2 once again being arranged at an intensity maximum of the pump mode 14 and the vertical emitter layer 3 being arranged at the zero crossing of the pump mode 14. As in the case of the exemplary embodiment illustrated in FIG. 3, the wave-guiding properties of the waveguide are modified by the recess in the cladding layer 8 or in both the cladding layer 8 and the waveguide 10 within the pump region in such a way that the intensity maximum is shifted from the pump layer in the direction of the vertical emitter layer 3.

Figure 6:
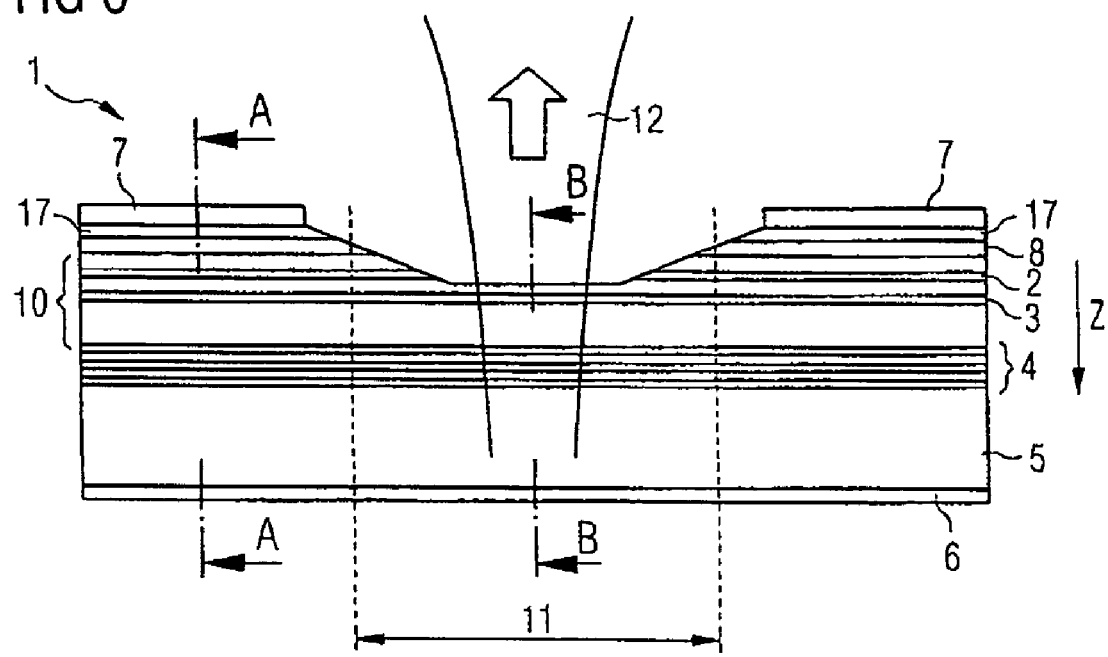
FIG. 6 shows a schematic sectional illustration of a sixth exemplary embodiment of a semiconductor device according to the invention.

FIG. 6 shows a sixth exemplary embodiment of the present invention. The semiconductor body once again essentially corresponds to the semiconductor body illustrated in FIG. 3 with the difference that the recess within the pump region is embodied deeper and extends from the cladding layer via the waveguide 10 to beyond the pump layer, that is to say that the pump layer is also removed within the pump region. This is advantageous since essentially no electrical excitation is effected on account of the arrangement of the contacts 6 and 7 within the pump region 11. Accordingly, in said region, the pump layer 2 does not contribute to the generation of the pump radiation field, but can disadvantageously absorb the pump radiation field. The layer sequence is preferably etched away to a desired depth within the pump region and subsequently covered with a passivation layer, for example with a dielectric such as silicon nitride.

The wave-guiding properties of the waveguide 10 are modified on account of the cutout within the pump region 11, in a manner similar to that in the case of the exemplary embodiments illustrated in FIG. 3 and in FIG. 5. As in the case of the exemplary embodiment illustrated in FIG. 5, a higher transversal mode having a zero crossing is provided as pump mode 14, it being the case that outside the pump region the pump layer 2 is arranged at an intensity maximum of the pump mode and the vertical emitter layer 3 is arranged at the zero crossing of the pump mode.

FIG. 7 schematically illustrates the vertical intensity profile of the pump mode along the line A-A outside the pump region of the embodiment shown in FIG. 6. Said intensity profile was determined for a corresponding semiconductor device by means of simulation calculations. The simulation calculations were based on an AlInGaP layer system having a pump wavelength of 630 nm and an emission wavelength of the vertical emitter of 650 nm.

The intensity of the pump field along the vertical direction z and also the associated refractive index of the semiconductor layer sequence are plotted.

By contrast, FIG. 8 illustrates a corresponding profile of the intensity of the pump radiation field within the pump region 11 along the line B-B of the embodiment shown in FIG. 6. An SiN layer serves as passivation layer 18.

The compression of the pump mode on account of the reduced width of the waveguide, on the one hand, and a shift in the pump mode in the direction of the vertical emitter layer, on the other hand, are clearly discernible. It should be noted that the maximum of the pump mode has deliberately not been shifted into the vertical emitter layer 3, since this can lead to an excessively high absorption of the pump mode within the pump region with the consequence that the pump radiation field is greatly reduced at the edge of the pump region, and an inhomogeneous pump profile can arise in this way.

The invention is preferably embodied as a semiconductor disk laser, for example as a VCSEL or a VECSEL. In particular, the vertical emitter is provided for forming a vertically emitting laser with an external resonator (VECSEL), the resonator being formed by the Bragg mirror and an external mirror.

In one preferred development of this embodiment, an element for frequency conversion, for example for frequency doubling, is provided within the external resonator. By way of example, nonlinear optical elements, in particular nonlinear crystals, are suitable for this purpose.

As mentioned above, one problem is the buildup of unwanted vertical modes. Such modes can be suppressed by increasing the respective losses for these modes. The reflectivity of the metallization should be chosen so low that the round trip losses induced by the metallization are higher than the round trip gain for vertical modes. That leads to the effect that vertical modes cannot build up. The same is true for the use of an absorption layer. If the round trip losses induced by the absorption layer are higher than the round trip gain for vertical modes, such modes cannot build up.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A semiconductor device comprising:
   an optically pumped vertical emitter having an active vertical emitter layer, and
   a pump radiation source used to generate a pump radiation field which propagates in a lateral direction and optically pumps the vertical emitter layer in a pump region, a wavelength of the pump radiation field being smaller than a wavelength of a radiation field generated by the vertical emitter,
   wherein the pump radiation source has an active pump layer, which is arranged above or below the vertical emitter layer in a vertical direction and which at least partly overlaps the vertical emitter layer as seen in the vertical direction, the active pump layer being arranged in such a way that the pump radiation field generated during operation has a higher power than a parasitic laterally propagating radiation field generated by the vertical emitter layer or that generation of a parasitic laterally propagating radiation field by the vertical emitter layer is suppressed,
   wherein the pump radiation source is electrically excited by charge carrier injection for generation of the pump radiation,
   wherein charge carriers of a first charge carrier type and charge carriers of a second charge carrier type are injected into the semiconductor device, and
   wherein the charge carriers of the first charge carrier type have a higher net trapping rate than the charge carriers of the second charge carrier type and are injected into the semiconductor device from a side, the active pump layer being at a smaller distance from said side than from the vertical emitter layer.

2. The semiconductor device as claimed in claim 1, further comprising a barrier having a selectivity with regard to the charge carrier types formed between the vertical emitter layer and the active pump layer.

3. The semiconductor device as claimed in claim 1, wherein the semiconductor device is doped partly with a first conductivity type and partly with a second conductivity type and has a space charge zone, the active pump layer being arranged within the space charge zone and the vertical emitter layer being arranged outside the space charge zone.

4. The semiconductor device as claimed in claim 1, further comprising a waveguide, wherein both the active pump layer and the vertical emitter layer are arranged within the waveguide.

5. The semiconductor device as claimed in claim 4, wherein the waveguide is assigned a pump mode having a filling factor $\Gamma_p$ of the active pump layer and a filling factor $\Gamma_v$ of the vertical emitter layer outside the pump region, the filling factor $\Gamma_p$ of the active pump layer being greater than the filling factor $\Gamma_v$ of the vertical emitter layer.

6. The semiconductor device as claimed in claim 5, wherein an intensity maximum is assigned to the pump mode, and the active pump layer is arranged closer to the intensity maximum than is the vertical emitter layer.

7. The semiconductor device as claimed in claim 5, wherein the pump mode has a zero crossing, and the vertical emitter layer is arranged closer to the zero crossing than to the active pump layer.

8. The semiconductor device as claimed in claim 1, wherein within the pump region, an absorption of a pump radiation in the vertical emitter layer is increased compared with regions of the vertical emitter layer which laterally adjoin the pump region.

9. The semiconductor device as claimed in claim 8, wherein the pump radiation field has a filling factor $\Gamma_p$ with regard to the active pump layer and a filling factor $\Gamma_v$ with regard to the vertical emitter layer, the ratio $\Gamma_p/\Gamma_v$ being decreased within the pump region compared with regions of the vertical emitter layer which laterally adjoin the pump region.

10. The semiconductor device as claimed in claim 8, wherein the active pump layer and the vertical emitter layer are arranged within a waveguide, the waveguide having wave-guiding properties modified within the pump region compared with regions which laterally adjoin the pump region.

11. The semiconductor device as claimed in claim 10, wherein the waveguide or layers adjoining the waveguide are at least partly removed within the pump region.

12. The semiconductor device as claimed in claim 10, wherein the waveguide or layers adjoining the waveguide are at least partly oxidized within the pump region.

13. The semiconductor device as claimed in claim 1, wherein the active pump layer is at least partly removed within the pump region.

14. The semiconductor device as claimed in claim 1, further comprising means for suppressing vertically propagating parasitic radiation fields, wherein the suppressing means are provided outside the pump region.

15. The semiconductor device as claimed in claim 14, wherein a material whose reflectivity is low enough to suppress an oscillation build-up of vertically propagating modes of parasitic radiation fields is chosen for contact metalizations.

16. The semiconductor device as claimed in claim 14, further comprising an absorber layer for suppressing vertically propagating parasitic radiation fields, wherein the absorber layer is provided outside the pump region.

17. The semiconductor device as claimed in claim 1, further comprising a mirror layer arranged above or below the active pump layer and the vertical emitter layer in the vertical direction.

18. The semiconductor device as claimed in claim 17, wherein the mirror layer is oxidized within the pump region.

19. The semiconductor device as claimed in claim 17, wherein the mirror layer is arranged between the vertical emitter layer and a substrate, and a radiation generated by the vertical emitter layer is coupled out from an opposite side to the substrate.

20. The semiconductor device as claimed in claim 17, wherein the vertical emitter layer is arranged between the mirror layer and a substrate, and a radiation generated by the vertical emitter layer is coupled out through the substrate.

21. The semiconductor device as claimed in claim 17, further comprising an external resonator assigned to the vertical emitter, wherein the external resonator is formed by the mirror layer and an external mirror.

22. The semiconductor device as claimed in claim 1, further comprising an external resonator assigned to the vertical emitter.

23. The semiconductor device as claimed in claim 22, further comprising an element for frequency conversion arranged within the external resonator.

24. The semiconductor device as claimed in claim 1, wherein the semiconductor device is formed in monolithically integrated fashion.

25. A semiconductor device comprising:
an optically pumped vertical emitter having an active vertical emitter layer;
a pump radiation source used to generate a pump radiation field which propagates in a lateral direction and optically pumps the vertical emitter layer in a pump region, a wavelength of the pump radiation field being smaller than a wavelength of a radiation field generated by the vertical emitter; and
a waveguide;
wherein the pump radiation source has an active pump layer, which is arranged above or below the vertical emitter layer in a vertical direction and which at least partly overlaps the vertical emitter layer as seen in the vertical direction, the active pump layer being arranged in such a way that the pump radiation field generated during operation has a higher power than a parasitic laterally propagating radiation field generated by the vertical emitter layer or that generation of a parasitic laterally propagating radiation field by the vertical emitter layer is suppressed,
wherein both the active pump layer and the vertical emitter layer are arranged within the waveguide, and
wherein the waveguide is assigned a pump mode having a filling factor $\Gamma_p$ of the active pump layer and a filling factor $\Gamma_v$ of the vertical emitter layer outside the pump region, the filling factor $\Gamma_p$ of the active pump layer being greater than the filling factor $\Gamma_v$ of the vertical emitter layer, and
wherein the pump mode has a zero crossing, and the vertical emitter layer is arranged closer to the zero crossing than to the active pump layer.

* * * * *